United States Patent [19]
Maekawa et al.

[11] Patent Number: 5,860,181
[45] Date of Patent: Jan. 19, 1999

[54] METHOD OF AND APPARATUS FOR CLEANING WORKPIECE

[75] Inventors: Toshiro Maekawa, Sagamihara; Satomi Hamada, Fujisawa; Koji Ono, Fujisawa; Atsushi Shigeta, Fujisawa; Masako Kodera, Yokohama, all of Japan

[73] Assignees: Ebara Corporation, Tokyo; Kabushiki Kaisha Toshiba, Kanagawa-ken, both of Japan

[21] Appl. No.: 716,889

[22] Filed: Sep. 20, 1996

[30] Foreign Application Priority Data

Sep. 20, 1995 [JP] Japan ................................. 7-266395

[51] Int. Cl.$^6$ ............................ A46B 13/02; A47L 25/00
[52] U.S. Cl. .................................. 15/102; 15/21.1; 15/77; 15/88.2; 15/88.3; 15/256.51
[58] Field of Search ........................ 15/88.4, 102, 256.5, 15/256.51, 21.1, 88.1, 88.2, 88.3, 77; 134/104.1

[56] References Cited

U.S. PATENT DOCUMENTS

| 4,476,601 | 10/1984 | Oka . | |
|---|---|---|---|
| 5,311,634 | 5/1994 | Andros . | |
| 5,375,291 | 12/1994 | Tateyama et al. . | |
| 5,636,401 | 6/1997 | Yonemizu et al. ........................ | 15/102 |

FOREIGN PATENT DOCUMENTS 7-74132   3/1995   Japan .

95/18697   7/1995   WIPO .

OTHER PUBLICATIONS

Patent Abstracts of Japan, vol. 10, No. 99 (E–396) [2156], 16 Apr. 1986 & JP–A–60 240129 (Fujitsu K.K.), 29 Nov. 1985 * abstract *.

IBM Technical Disclosure Bulletin, vol. 38, No. 6, Jun. 1995, New York, US, pp. 527–528, XP000520759 "CMP Pad Conditioner for Nonplanar Polishing Pads" * the whole document *.

*Primary Examiner*—Randall E. Chin
*Attorney, Agent, or Firm*—Wenderoth, Lind & Ponack, L.L.P.

[57] ABSTRACT

A method of and an apparatus for cleaning workpiece is suitable for cleaning a substrate such as a semiconductor substrate, a glass substrate, or a liquid crystal panel to a high level of cleanliness. The method of cleaning a workpiece comprises the steps of holding a workpiece, scrubbing the workpiece with a cleaning member, and rubbing the cleaning member against a member having a rough surface to carry out a self-cleaning of the cleaning member. The cleaning member which is contaminated by having scrubbed the workpiece is rubbed against the rough surface, and the rough surface scrapes the contaminant off the cleaning member. Therefore, the contaminant can effectively be removed from the cleaning member, and hence the cleaning member has a high self-cleaning effect.

9 Claims, 6 Drawing Sheets

METHOD OF AND APPARATUS FOR CLEANING WORKPIECE

BACKGROUND OF THE INVENTION

1. Field of the Invention:

The present invention relates to a method of and an apparatus for cleaning a workpiece, and more particularly to a method of and an apparatus for cleaning a substrate such as a semiconductor substrate, a glass substrate, or a liquid crystal panel to a high level of cleanliness.

2. Description of the Prior Art:

As semiconductor devices become more highly integrated in recent years, circuit interconnections become thinner and the distances between those interconnections also become smaller. While processing a semiconductor substrate, particles such as minute semiconductor particles, dust particles, or small crystalline pieces tend to be attached to the semiconductor substrate. If particles existing on the semiconductor substrate are greater in size than the distances between interconnections on the semiconductor substrate, then short-circuits will possibly be developed between the interconnections. To avoid such a drawback, any particles present on the semiconductor substrate are required to be sufficiently smaller than the distances between interconnections on the semiconductor substrate. This holds true for the processing of other substrates including a glass substrate for use as a photomask, a liquid crystal panel, etc. To meet such a requirement, there has been demands for a cleaning process capable of removing smaller particles in the submicron level from semiconductor substrates and other substrates.

It has heretofore been customary to clean a semiconductor substrate by scrubbing it with a cleaning member made of a brush or a sponge.

Research efforts have been made to find a cleaning member which can exhibit a cleaning effect better than the brush or the sponge. As a result, it has been found that an abrasive cloth, used in recent years to polish the surface of a semiconductor wafer to planarize the same in its fabrication process, is effective to clean a workpiece, as proposed in Japanese patent application No. 7-129588 (corresponding to U.S. patent application Ser. No. 08/434,754, now abandoned).

In scrubbing a workpiece with a cleaning member such as a brush, a sponge, or an abrasive cloth, since the cleaning member is held in direct contact with the workpiece, the cleaning effect of the cleaning member depends on the contamination of the cleaning member. Specifically, as the contamination of the cleaning member which is contaminated by the contaminant removed from the workpiece progresses, the contaminant deposited on the cleaning member contaminates the workpiece again, thus lowering the cleaning effect which the cleaning member has. Such a phenomenon is referred to as a reverse contamination. The cleaning member has to be replaced with a fresh cleaning member before the cleaning member causes the reverse contamination.

Replacing the cleaning member with a fresh cleaning member requires the cleaning apparatus to be shut off. Consequently, the processing capability of the cleaning apparatus is lowered, and dust particles produced in a cleaning environment by the replacement of the cleaning member poses problems.

It is desirable to purify the cleaning member without replacing the same when it is contaminated. Such a purifying process is known as a self-cleaning process. According to the conventional self-cleaning processes, it has heretofore been customary to rinse the cleaning member in a cleaning liquid or apply a water jet or an ultrasonically vibrated water stream to the cleaning member.

Inasmuch as the self-cleaning of the cleaning member governs the cleaning effect thereof, prolongs a service life of the cleaning member, and increases the processing capability of the cleaning apparatus, there have been demands for more effective self-cleaning processes.

SUMMARY OF THE INVENTION

It is therefore an object of the present invention to provide a method of and an apparatus for cleaning a workpiece with a cleaning member which is cleaned by a self-cleaning of the cleaning member to a high level of cleanliness for thereby increasing the cleaning effect thereof, prolonging the service life thereof, and the processing capability of the cleaning apparatus.

According to an aspect of the present invention, there is provided a method of cleaning a workpiece, comprising the steps of: holding a workpiece; scrubbing the workpiece with a cleaning member; and rubbing the cleaning member against a member having a rough surface to carry out a self-cleaning of the cleaning member.

According to another aspect of the present invention, there is provided a method of cleaning a workpiece, comprising the steps of: holding a workpiece; scrubbing the workpiece with a cleaning member made of an abrasive cloth; and bringing the cleaning member into contact with a brush to carry out a self-cleaning of the cleaning member.

According to another aspect of the present invention, there is also provided an apparatus for cleaning a workpiece, comprising: a holding unit for holding a workpiece; a cleaning unit movable relatively to the workpiece; a cleaning member provided on said cleaning unit for scrubbing the workpiece; and a flat portion having a rough surface for contacting said cleaning member to carry out a self-cleaning of the cleaning member.

According to the present invention, the cleaning member which is contaminated by having scrubbed the workpiece is rubbed against the rough surface, and the rough surface scrapes the contaminant off the cleaning member. Therefore, the contaminant can effectively be removed from the cleaning member, and hence the cleaning member has a high self-cleaning effect. Inasmuch as the cleaning member is rubbed against the rough surface, a fresh cleaning surface is created on the cleaning member.

If the cleaning member comprises a sponge, the cleaning member is pressed against a flat portion until the cleaning member is elastically deformed. Consequently, the contaminant attached to the cleaning member is squeezed out of the cleaning member together with the cleaning liquid absorbed by the cleaning member.

If the cleaning member comprises an abrasive cloth, it is cleaned by a brush. Since the contaminant, particularly particles, on the cleaning member are directly scraped by the brush, the contaminant can effectively be removed from the cleaning member, and hence the cleaning member has a high self-cleaning effect.

Because the cleaning member which is contaminated by having scrubbed the workpiece is cleaned to a high level of cleanliness by carrying out a self-cleaning of the cleaning member, the cleaning effect of the cleaning member is increased. The cleaning member has an increased service life, and the processing capability of the cleaning apparatus is increased.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

A cleaning apparatus according to a first embodiment of the present invention will be described below with reference to FIGS. 1 through 3.

Figure 1:
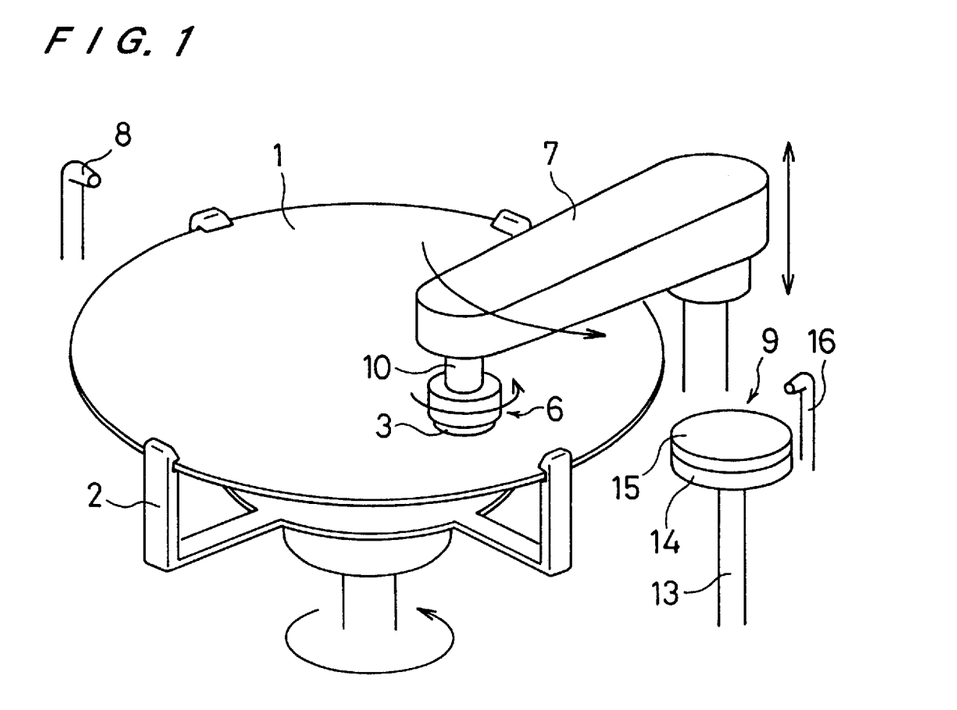
FIG. 1 is a perspective view of a cleaning apparatus according to a first embodiment of the present invention, for carrying out a cleaning method according to the present invention.

As shown in FIG. 1, the cleaning apparatus includes a spin chuck 2 for holding a semiconductor substrate 1, a rotatable cleaning unit 6 having a cleaning member 3 attached to a lower surface thereof, and a vertically and horizontally movable swing arm 7 which supports the rotatable cleaning unit 6 on its distal end in overhanging relation to the semiconductor substrate 1 held by the spin chuck 2. The cleaning apparatus further includes a cleaning liquid nozzle 8 for ejecting a cleaning liquid onto an upper surface, to be cleaned, of the semiconductor substrate 1, and a self-cleaning unit 9 for carrying out a self-cleaning of the cleaning unit 6. The spin chuck 2 is rotatable in a horizontal plane at a predetermined speed, and the cleaning member 3 is made of polyurethane foam having micropores therein. The cleaning unit 6 is supported on the distal end of the swing arm 7 by a vertical shaft 10 extending downwardly from the distal end of the swing arm 7. The cleaning unit 6 can be rotated at a given speed by the shaft 10.

The semiconductor substrate 1 which is to be cleaned by the cleaning apparatus is transferred to a position over the spin chuck 2 by a robot arm or the like, and held by the spin chuck 2 with its surface, to be cleaned, facing upwardly. The semiconductor substrate 1 held by the spin chuck 2 is rotated at a predetermined speed, and simultaneously a cleaning liquid is ejected from the cleaning liquid nozzle 8 toward a substantially central area of the semiconductor substrate 1.

The swing arm 7 is lifted to raise the cleaning unit 6 from the self-cleaning unit 9, and then swung horizontally to move the cleaning unit 6 to a position where the cleaning unit 6 is located above a substantially central area of the semiconductor substrate 1. At this time, the cleaning unit 6 is not rotated. Then, the swing arm 7 is lowered to bring the cleaning unit 6 into contact with the semiconductor substrate 1. Immediately before the cleaning unit 6 contacts the semiconductor substrate 1, the cleaning unit 6 starts being rotated at a given speed by the shaft 10 about the axis thereof.

The cleaning member 3 of the cleaning unit 6, which is being independently rotated in contact with the upper surface of the semiconductor substrate 1 which is supported and rotated by the spin chuck 2, is pressed against the semiconductor substrate 1 by the swing arm 7. The swing arm 7 is swung at a given speed to an outer circumferential edge of the semiconductor substrate 1 to cause the cleaning member 3 to scrub the semiconductor substrate 1.

If the semiconductor substrate 1 is rotated at a constant speed, the peripheral speed of the semiconductor substrate 1 at the central area thereof differs from the peripheral speed of the semiconductor substrate 1 at the outer circumferential area thereof. Therefore, if the swing arm 7 is swung at a constant speed, then the cleaning member 3 contacts the semiconductor substrate 1 at different rates in different positions on the semiconductor substrate 1, resulting in irregular cleaning effects. Therefore, the speed at which the swing arm 7 is swung or the speed at which the semiconductor substrate 1 rotates should be controlled to allow the cleaning member 3 to scrub the semiconductor substrate 1 uniformly over its entire upper surface.

When the cleaning member 3 reaches the outer circumferential edge of the semiconductor substrate 1, the swing arm 7 is stopped in its horizontal swinging motion, and then lifted to move the cleaning member 3 away from the upper surface of the semiconductor substrate 1. Then, the swing arm 7 is swung back to the central area of the semiconductor substrate 1 for repeating the above cleaning cycle. After the above cleaning cycle is carried out at least once, the supply of the cleaning liquid from the cleaning liquid nozzle 8 is stopped, and the swing arm 7 is swung to the self-cleaning unit 9. The cleaning unit 6 is then lowered onto the self-cleaning unit 9 for self-cleaning.

If the semiconductor substrate 1 is to be dried after it is cleaned, the spin chuck 2 is rotated at a high speed to dry the semiconductor substrate 1 in a spinning action. For cleaning the semiconductor substrate 1 in a next process, at the same time when the supply of the cleaning liquid from the cleaning liquid nozzle 8 is stopped, the rotation of the semiconductor substrate 1 is also stopped, and the semiconductor substrate 1 is transferred to the next process in such a state that the upper surface of the semiconductor substrate 1 is not dried.

Figure 2:
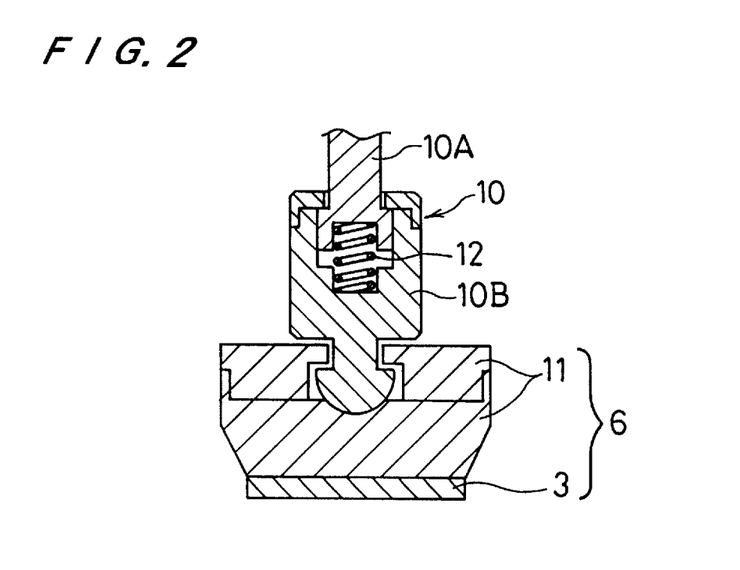
FIG. 2 is a vertical cross-sectional view of a cleaning unit of the cleaning apparatus shown in FIG. 1.

FIG. 2 shows in cross section the cleaning unit 6 of the cleaning apparatus shown in FIG. 1. As shown in FIG. 2, the cleaning unit 6 is mounted on the lower end of the shaft 10. The cleaning unit 6 comprises a cartridge 11 and the cleaning member 3 which is attached to a lower surface of the cartridge 11. The cleaning member 3 comprises an abrasive cloth for polishing the semiconductor substrate 1. The abrasive cloth is cut to such a suitable size as to be attached to the lower surface of the cartridge 11. Since the abrasive cloth for polishing the semiconductor substrate 1 has an adhesive layer on its reverse side, the cleaning member 3 can be attached to the lower surface of the cartridge 11 by the use of the adhesive layer. The cartridge 11 and the lower end of the shaft 10 are held in contact with each other through spherical surfaces which allow the cleaning member 3 to be held in uniform contact with the semiconductor substrate 1 even when the semiconductor substrate 1 is tilted with respect to the horizontal plane.

The shaft 10 comprises an upper shaft member 10A and a lower shaft member 10B which are coupled to each other with a helical compression spring 12 interposed therebetween. The helical compression spring 12 serves to dampen forces applied to the semiconductor substrate 1 when the cleaning unit 6 is in contact with the semiconductor substrate 1. Therefore, the cleaning surface of the cleaning member 3 can be kept in contact with the upper surface of the semiconductor substrate 1 under substantially constant pressure. Because of the helical compression spring 12, the semiconductor substrate 1 is prevented from being damaged under excessive forces applied from the cleaning unit 6 to the semiconductor substrate 1 even when the semiconductor substrate 1 is tilted.

The cleaning member 3 has micropores defined in the polyurethane foam of the abrasive cloth, and the micropores are present at least in its surface for contact with the semiconductor substrate 1. While the micropores may be available in various sizes, those micropores which have an average diameter ranging from 10 to 200 µm are suitable for use in the cleaning member 3. When the cleaning member 3 is pressed against the semiconductor substrate 1 and the cleaning member 3 and the semiconductor substrate 1 are moved relatively to each other, particles on the semiconductor substrate 1 are scraped off by edges of the micropores of the cleaning member 3, trapped in the micropores, and removed from the semiconductor substrate 1.

Figure 3:
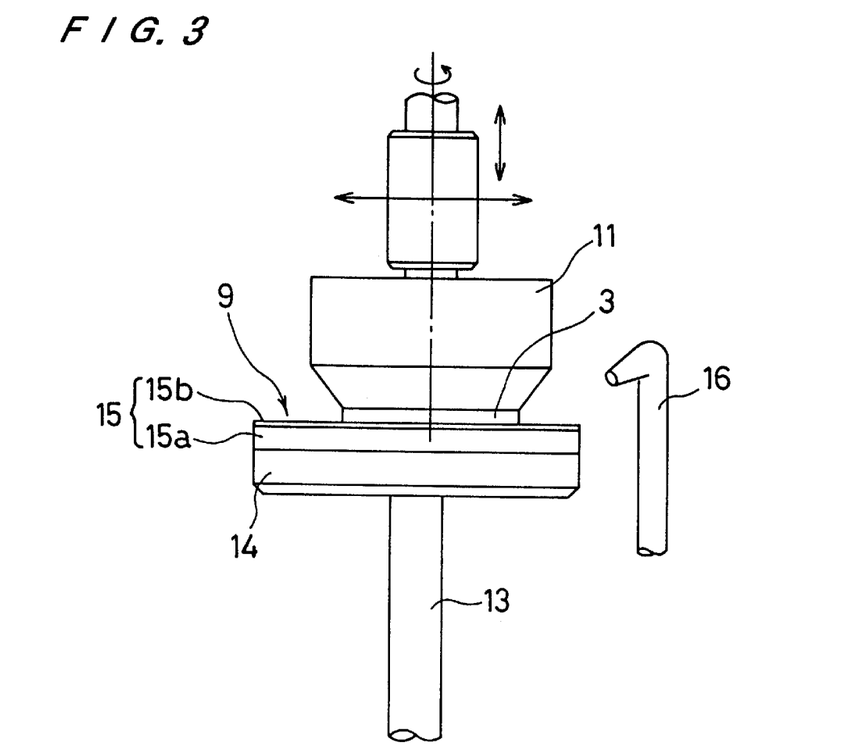
FIG. 3 is a vertical elevational view of a self-cleaning unit of the cleaning apparatus shown in FIG. 1.

FIG. 3 shows in vertical elevation the self-cleaning unit 9 for carrying out a self-cleaning of the cleaning member 3.

As shown in FIG. 1, the self-cleaning unit 9 is positioned on the path of angular movement of the cleaning unit 6. The self-cleaning unit 9 comprises a flat plate 14 supported on the upper end of a support shaft 13, a dressing member 15 attached to an upper surface of the flat plate 14, and a cleaning liquid nozzle 16 for supplying water onto the dressing member 15. The dressing member 15 comprises a base plate 15a mounted on the flat plate 14 and a layer 15b made of diamond pellets electrodeposited on an upper surface of the base plate 15a. Therefore, the dressing member 15 has an irregular upper surface by the diamond pellets.

After having cleaned the semiconductor substrate 1, the cleaning unit 6 is moved to the self-cleaning unit 9, and presses the cleaning member 3 against the dressing member 15 under a predetermined pressure. The swing arm 7 is swung and the cleaning unit 6 is rotated to rub the lower cleaning surface of the cleaning member 3 against the dressing member 15. At the same time, water is supplied from the cleaning liquid nozzle 16 to the region where the cleaning member 3 contacts the dressing member 15, for thereby carrying out a self-cleaning of the cleaning member 3.

The dressing member 15 with the layer 15b of diamond pellets electrodeposited on the base plate 15a is capable of generating a new cleaning surface of the cleaning member 3 by both scraping a contaminated surface layer off the cleaning member 3 and mechanically abrading a contaminant attached to the cleaning surface of the cleaning member 3, thus creating a fresh cleaning surface thereon. These scraping and mechanically abrading actions depend on the magnitude of the pressure under which the cleaning member 3 is pressed against the dressing member 15, and the surface roughness of the dressing member 15.

Since the cleaning apparatus has a mechanism for controlling the pressure under which the cleaning member 3 is pressed against the semiconductor substrate 1, the mechanism may be used to control the pressure under which the cleaning member 3 is pressed against the dressing member 15.

Figure 4:
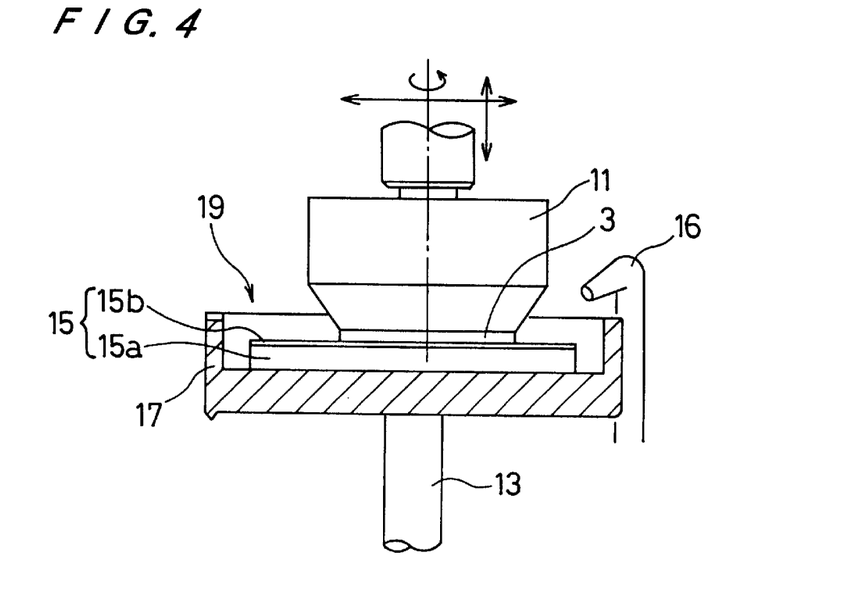
FIG. 4 is a vertical elevational view, partly in cross section, of another self-cleaning unit which can be used in the cleaning apparatus shown in FIG. 1.

FIG. 4 shows another self-cleaning unit 19 which can be used in the cleaning apparatus shown in FIG. 1. As shown in FIG. 4, the self-cleaning unit 19 has a cleaning cup 17 mounted on the upper end of the support shaft 13. The cleaning cup 17 has a flat bottom supporting thereon the dressing member 15 which comprises the layer 15b of diamond pellets electrodeposited on the base plate 15a. The self-cleaning unit 19 which is incorporated in the cleaning apparatus shown in FIG. 1 operates as follows: Water is supplied to the cleaning cup 17 from the cleaning liquid nozzle 16 so as to overflow the cleaning cup 17, and simultaneously the cleaning member 3 of the cleaning unit 6 is rubbed against the dressing member 15. When the self-cleaning of the cleaning member 3 is finished, the cleaning member 3 is lifted slightly off the dressing member 15 and kept in the water contained in the cleaning cup 17. In this manner, the cleaning member 3 can be stored in place without being dried. The cleaning member 3 is prevented from being dried in order to prevent the contaminant attached to the cleaning member 3 from adhering strongly to the cleaning member 3.

Figure 5:
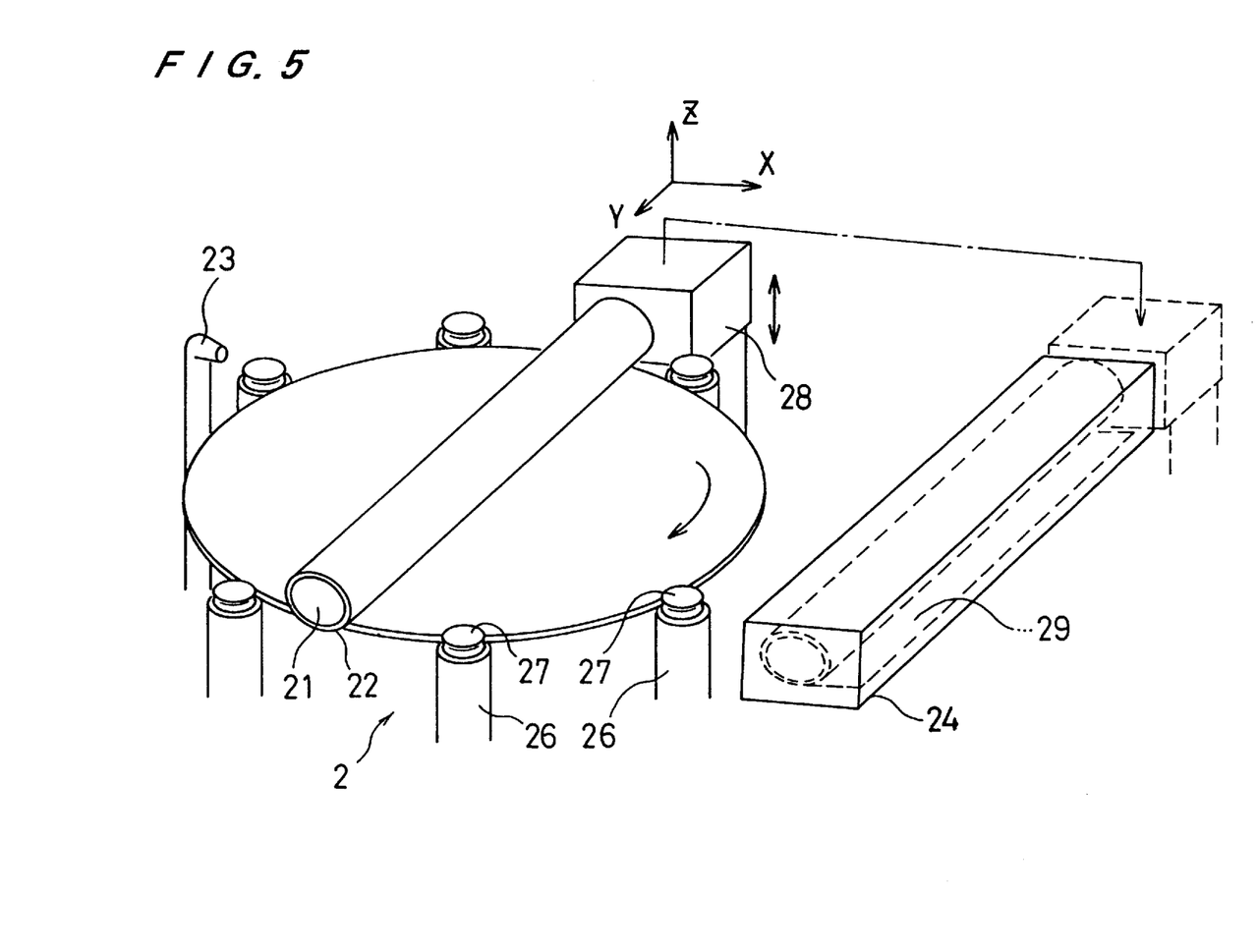
FIG. 5 is a perspective view of a cleaning apparatus according to a second embodiment of the present invention, for carrying out the cleaning method according to the present invention.

FIG. 5 shows in perspective a cleaning apparatus according to a second embodiment of the present invention.

As shown in FIG. 5, the cleaning apparatus comprises a spin chuck 2 for holding and rotating a semiconductor substrate 1, a cylindrical cleaning roller 21 rotatable about an axis parallel to the upper surface, to be cleaned, of the semiconductor substrate 1, a cleaning liquid nozzle 23 for supplying a cleaning liquid onto the upper surface of the semiconductor substrate 1, and a cleaning cup 24 positioned in a retracted position spaced from the spin chuck 2, for cleaning a cleaning member on the cleaning roller 21 after it has cleaned the semiconductor substrate 1.

The spin chuck 2 comprises a plurality of fixed spindles 26 and a plurality of rolls 27 rotatably mounted on the respective upper ends of the spindles 26 for holding the outer circumferential edge of the semiconductor substrate 1. The semiconductor substrate 1 is rotated by rotational forces transmitted from the rolls 27 to the outer circumferential edge of the semiconductor substrate 1. A cleaning member 22 is wound around the cleaning roller 21. The cleaning member 22 comprises a layer of PVA sponge. The cleaning roller 21 is supported in a cantilevered fashion by a support column 28 which is movable in the directions indicated by the arrows X and Z in FIG. 5.

The semiconductor substrate 1 is transferred to a position over the spin chuck 2 by a robot arm or the like, and held by the spin chuck 2 with its surface, to be cleaned, facing upwardly. The semiconductor substrate 1 is rotated at a predetermined speed by the rolls 27, and simultaneously a cleaning liquid is ejected from the cleaning liquid nozzle 23 toward a substantially central area of the semiconductor substrate 1. All of the rolls 27 are positively rotated at the same speed by a common motor or motors (not shown). If at least one of the rolls 27 were positively rotated and the other rolls 27 were idly rotated in contact with the semiconductor substrate 1, then those other rolls 27 would tend to slip against the semiconductor substrate 1 and be worn due to frictional engagement therewith, thereby producing particles which would contaminate the semiconductor substrate 1.

The support column 28 is moved to transfer the cleaning roller 21 with the cleaning member 22 wound therearound from the cleaning cup 24 in the retracted position to a position over the semiconductor substrate 1, and then lowered to bring the cleaning member 22 into contact with the upper surface of the semiconductor substrate 1. The cleaning roller 21 starts being rotated immediately before it contacts the semiconductor substrate 1.

After scrubbing the semiconductor substrate 1 with the cleaning member 22 for a predetermined period of time, the cleaning roller 21 is lifted off the semiconductor substrate 1 by ascending movement of the support column 28, and the semiconductor substrate 1 is discharged out of the cleaning apparatus. Thereafter, the cleaning member 22 on the cleaning roller 21 is moved by the support column 28 into the cleaning cup 24 as indicated by the dot-and-dash line. The cleaning cup 24 is filled with a cleaning liquid. A quartz plate 29 is attached to the bottom of the cleaning cup 24. The cleaning member 22 is pressed against an upper surface of the quartz plate 29 while the cleaning member 22 is being cleaned by the cleaning liquid in the cleaning cup 24.

Figure 6:
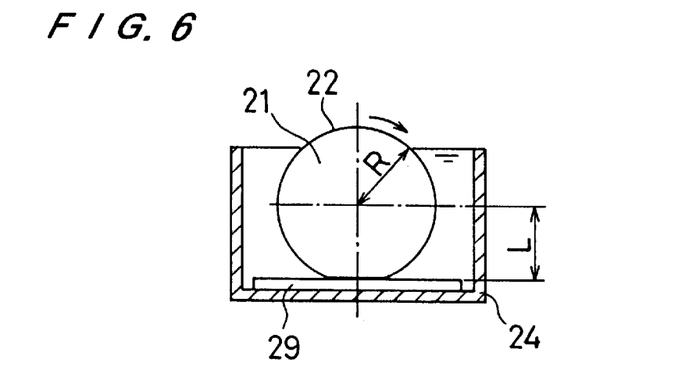
FIG. 6 is a cross-sectional view showing the positional relationship between a cleaning member and a quartz plate in a cleaning cup of the cleaning apparatus shown in FIG. 5.

FIG. 6 shows the positional relationship between the cleaning member 22 and the quartz plate 29 in the cleaning cup 24. If it is assumed that the distance (radius) from the center of the cleaning roller 21 to the surface of the sponge layer of the cleaning member 22 is represented by R and the distance from the center of the cleaning roller 21 to the upper surface of the quartz plate 29 is represented by L, then the cleaning member 22 is pressed against the quartz plate 29 and the sponge layer of the cleaning member 22 is deformed until the distance L is much shorter than the distance R (L<R). At this time, the cleaning roller 21 is rotated about its own axis.

Since the sponge layer of the cleaning member 22 is elastically deformed (compressed) by the quartz plate 29, the clearing liquid absorbed by the sponge layer is squeezed out of the sponge layer, thus forcing a contaminant attached to the surface of the sponge layer out of the sponge layer together with the cleaning liquid. This self-cleaning effect acts on the entire surface of the sponge layer because the cleaning roller 21 is rotated.

Figure 7:
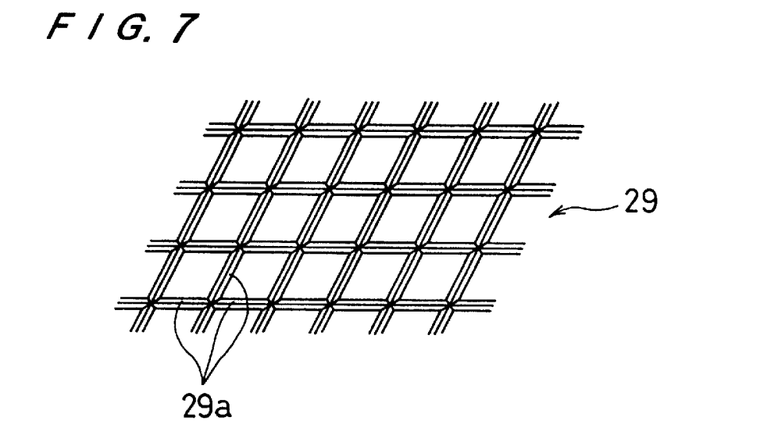
FIG. 7 is an enlarged fragmentary perspective view of a surface of the quartz plate.

FIG. 7 shows in an enlarged scale the upper surface of the quartz plate 29. As shown in FIG. 7, the quartz plate 29 has a grid-like pattern of minute grooves 29a which roughen the upper surface of the quartz plate 29. Since the cleaning member 22 is pressed against the rough upper surface of the quartz plate 29 for self-cleaning, the contaminant on the cleaning member 22 is effectively scraped off by the rough upper surface of the quartz plate 29, and hence the self-cleaning effect of the cleaning member 22 is increased. While the minute grooves 29a in the quartz plate 29 may not necessarily be arranged in a grid pattern, they should preferably be patterned in identical shapes over the entire surface of the quartz plate 29.

When the cleaning member 22 which has scrubbed the semiconductor substrate 1 is cleaned in rubbing engagement with the rough upper surface of the quartz plate 29, certain vibrations are imparted to the cleaning member 22 to directly scrape the contaminant off the cleaning member 22. Accordingly, the cleaning member 22 can be cleaned to a high level of cleanliness.

Figure 8:
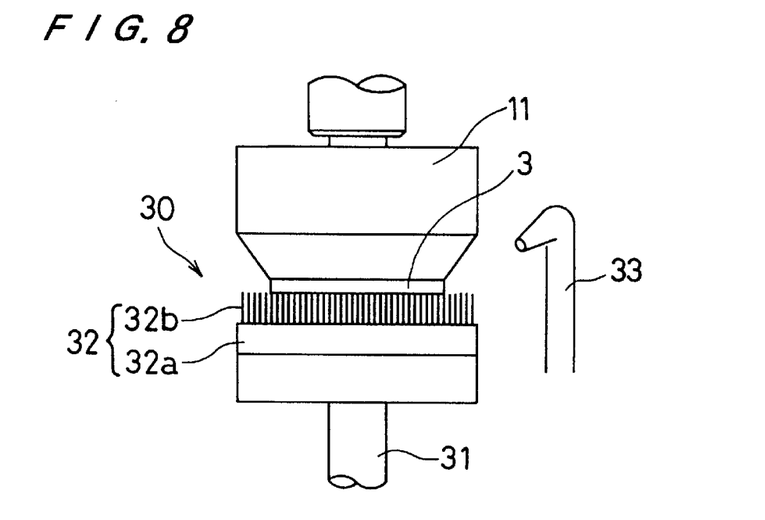
FIG. 8 is a vertical elevational view of still another self-cleaning unit which can be used in the cleaning apparatus shown in FIG. 1.

FIG. 8 shows still another self-cleaning unit 30 which can be used in the cleaning apparatus shown in FIG. 1.

As shown in FIG. 8, the self-cleaning unit 30 comprises a brush 32 supported on the upper end of a support shaft 31, and a cleaning liquid nozzle 33 for supplying water to the brush 32. The brush 32 comprises a brush base 32a and a number of nylon bristles 32b upwardly mounted on the brush base 32a.

The self-cleaning unit 30 which is incorporated in the cleaning apparatus shown in FIG. 1 operates as follows: The cleaning member 3 which has scrubbed the semiconductor substrate 1 is moved above the self-cleaning unit 30. The swing arm 7 (see FIG. 1) is then lowered until the cleaning member 3 contacts the bristles 32b, and then the cleaning unit 6 is rotated to clean the cleaning member 3 with the bristles 32b. At the same time, the cleaning liquid nozzle 33 supplies water to the region where the cleaning member 3 is rubbed against the bristles 32b.

Because the cleaning member 3 is held against the brush 32 and moved relatively to the brush 32, a contaminant, particularly particles, attached to the cleaning member 3 when it has scrubbed the semiconductor substrate 1, is removed from the cleaning member 3 by the brush 32.

According to a modification, the brush 32 may be fixed to the bottom of a cleaning cup as shown in FIG. 4, and the cleaning member 3 and the brush 32 may be moved relatively to each other in the water contained in the cleaning cup. If the water is supplied at a rate to overflow the cleaning cup, then since removed particles can be discharged out of the cleaning cup by the overflow of water, the cleaning member 3 can be cleaned highly effectively by self-cleaning.

The structure of the cleaning apparatus, the type of the cleaning member, and the method of self-cleaning may be combined as desired. For example, the abrasive cloth may be attached to the cylindrical roller 21 shown in FIG. 5, and may be cleaned by the brush 32 shown in FIG. 8.

Figure 9:
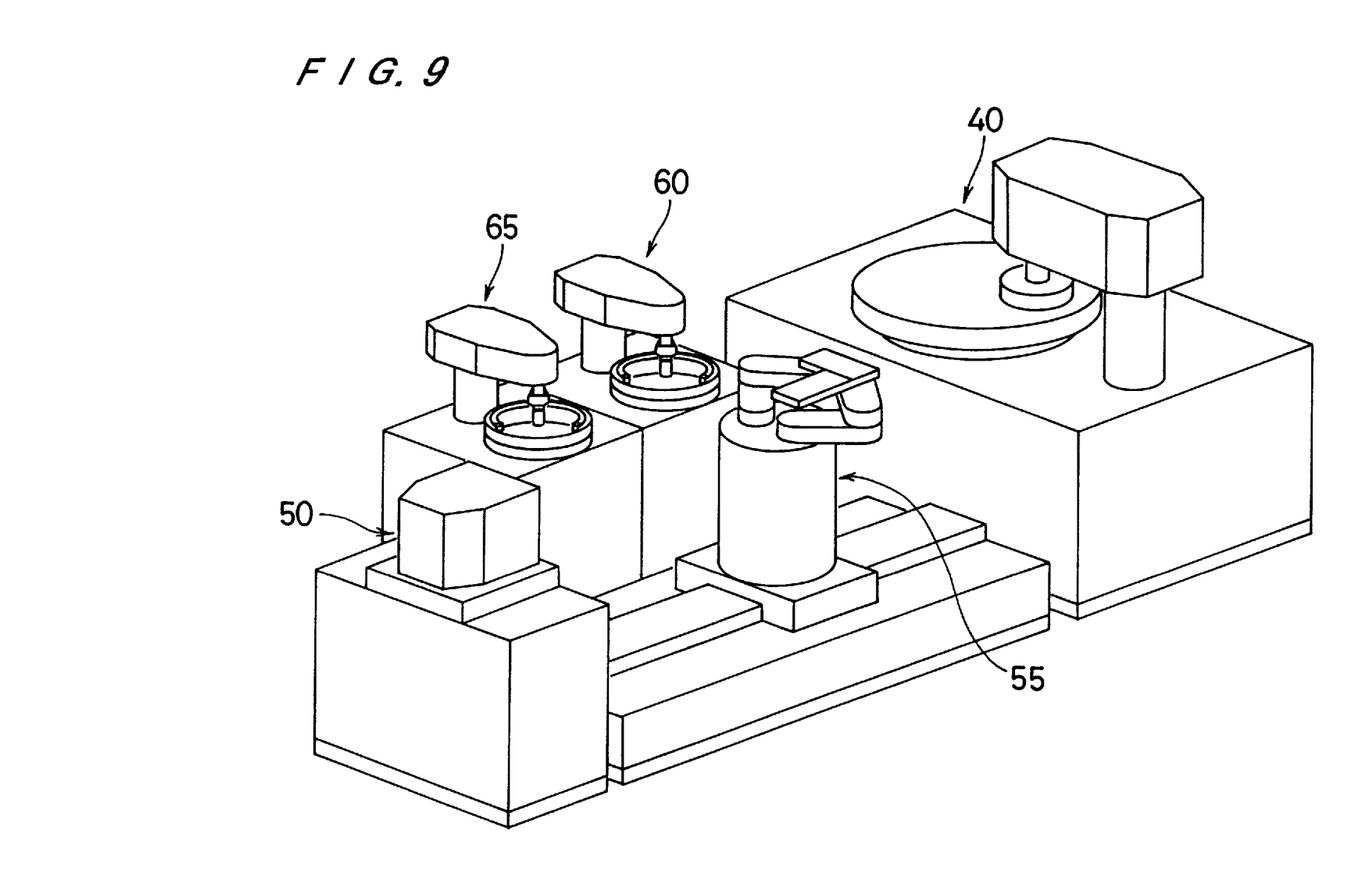
FIG. 9 is a perspective view of a system composed of cleaning apparatus according to the present invention which are combined with a polishing apparatus for polishing semiconductor sustrates.

FIG. 9 shows a system composed of a cleaning apparatus according to the present invention which are combined with a polishing apparatus for polishing semiconductor substrates. As shown in FIG. 9, the system comprises a polishing apparatus 40, a substrate storage cassette 50, a feed robot 55, a first cleaning apparatus 60, and a second cleaning apparatus 65.

A polishing step which is carried out by the polishing apparatus 40 is one of the steps of a semiconductor fabrication process, and serves to polish a semiconductor substrate to a flat mirror finish. When interconnections are to be formed as layers on the surface of a semiconductor substrate, the surface of the semiconductor substrate is polished to a flat mirror finish before the layers are deposited, so that the layers will subsequently be formed smoothly on the semiconductor substrate.

Figure 10:
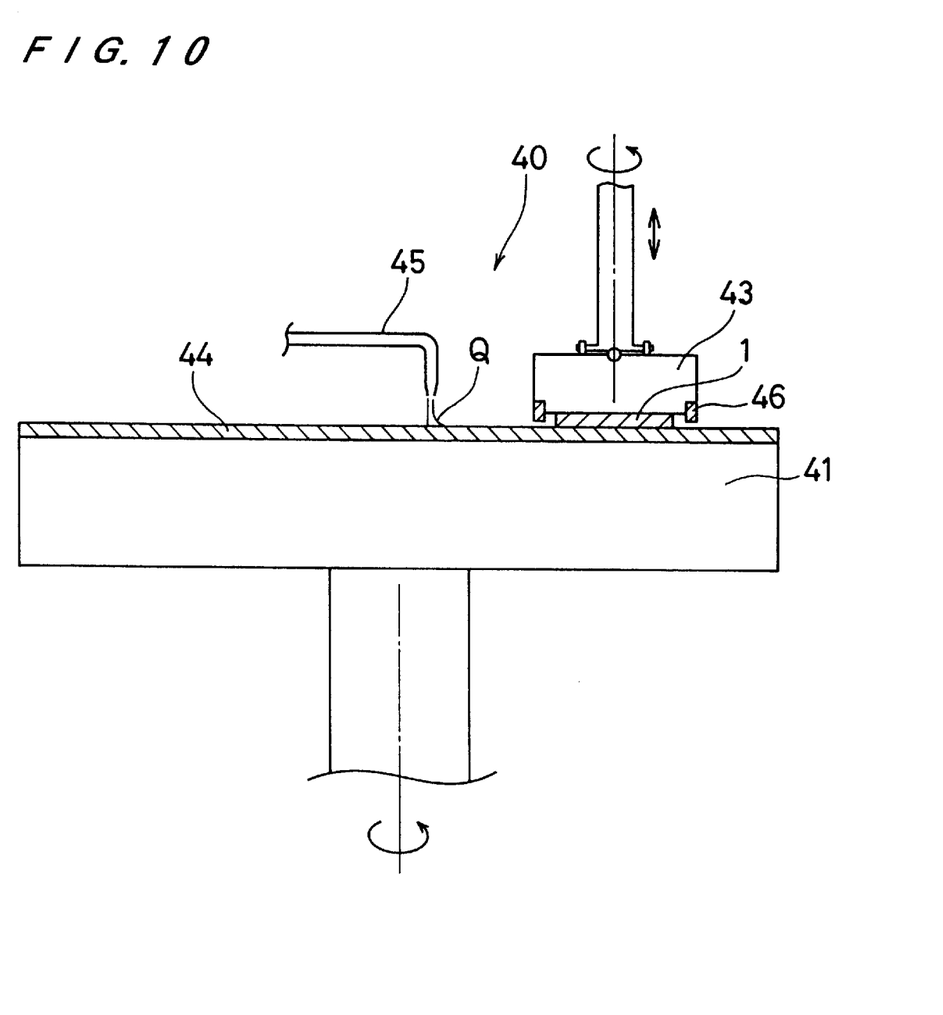
FIG. 10 is a vertical cross-sectional view of the polishing apparatus shown in FIG. 9.

FIG. 10 shows the polishing apparatus 40 in detail. As shown in FIG. 10, the polishing apparatus 40 comprises a turntable 41 and a top ring 43 for holding and pressing a semiconductor substrate 1 against the turntable 41. The turntable 41 is coupled to a motor (not shown) and can be rotated about its own axis in the direction indicated by the arrow. A polishing abrasive cloth 44 is applied to the upper surface of the turntable 41 for contact with the semiconductor substrate 1. The polishing abrasive cloth 44 is made of the same material as that of the cleaning member 3 shown in FIGS. 1 and 2.

The top ring 43 is coupled to a motor (not shown) and also to a cylinder (not shown) for vertically moving the top ring 43. Therefore, the top ring 43 can be vertically moved in the directions indicated by the arrows and also can be rotated about its own axis, so that the semiconductor substrate 1 can be pressed against the polishing abrasive cloth 44 under a desired pressure. An abrasive solution nozzle 45 is positioned over the turntable 41 for supplying an abrasive solution Q onto the polishing abrasive cloth 44 attached to the upper surface of the turntable 41.

In operation, a semiconductor substrate 1 to be polished is taken out from the substrate storage cassette 50, reversed to face a surface to be polished downwardly, and then conveyed to the polishing apparatus 40 by the feed robot 55. In the polishing apparatus 40, the semiconductor substrate 1 is supported on the lower surface of the top ring 43, and then pressed against the polishing abrasive cloth 44 on the upper surface of the rotating turntable 41 while the semiconductor substrate 1 is being rotated by the top ring 43. The abrasive solution Q is supplied from the abrasive solution nozzle 45 onto the polishing abrasive cloth 44. The lower surface of the semiconductor substrate 1 is thus polished by the polishing abrasive cloth 44 with the abrasive solution Q existing between the lower surface of the semiconductor substrate 1 and the polishing abrasive cloth 44.

After having been polished, the semiconductor substrate 1 carries on its surface abrasive grain contained in the abrasive solution Q and ground-off particles of the semiconductor substrate 1, and is contaminated by an alkaline metal of potassium (K) because the abrasive solution is of an alkaline base. These abrasive grain, particles, and contaminant have to be cleaned away subsequently.

As shown in FIG. 9, the polished semiconductor substrate 1 is turned upside down to make the polished surface upper side and conveyed by the feed robot 55 to the first cleaning apparatus 60 in which the semiconductor substrate 1 is scrubbed by a brush to remove most of the abrasive grain, particles, and contaminants from the surface of the semiconductor substrate 1.

After the semiconductor substrate 1 has been cleaned by the cleaning apparatus 60, the semiconductor substrate 1 is fed to the second cleaning apparatus 65 before the surface of the semiconductor substrate 1 is dried. In the second cleaning apparatus 60, the semiconductor substrate 1 is scrubbed by the cleaning member 3 shown in FIGS. 1 and 2 to remove minute particles or submicron particles from the surface of the semiconductor substrate 1 in the manner described above.

As shown in FIGS. 1 and 2, after having cleaned the semiconductor substrate 1, the cleaning unit 6 is moved to the self-cleaning unit 9, and presses the cleaning member 3 against the dressing member 15 under a predetermined pressure. The swing arm 7 is swung and the cleaning unit 6 is rotated to rub the lower cleaning surface of the cleaning member 3 against the dressing member 15. At the same time, water is supplied from the cleaning liquid nozzle 16 to the region where the cleaning member 3 contacts the dressing member 15, for thereby carrying out a self-cleaning of the cleaning member 3.

The cleaning method according to the present invention has been described above in combination with the polishing step. However, the cleaning method according to the present invention may be any of various steps of the semiconductor fabrication process, e.g., an etching step or a chemical vapor deposition (CVD) step.

As described above, according to the present invention, the cleaning member which is contaminated by cleaning the workpiece can be cleaned to a high level of cleanliness by carrying out a self-cleaning of the cleaning member, and hence the cleaning effect of the workpiece is enhanced. Further, a service life of the cleaning member is prolonged, and the processing capability of the cleaning apparatus is increased.

Although certain preferred embodiments of the present invention have been shown and described in detail, it should be understood that various changes and modifications may be made therein without departing from the scope of the appended claims.

What is claimed is:

1. An apparatus for cleaning a workpiece, comprising:
   a holding unit for holding a workpiece;
   a cleaning unit movable relatively to the workpiece;
   a cleaning member provided on said cleaning unit for scrubbing the workpiece; and
   a flat portion having a rough surface for contacting said cleaning member to carry out a self-cleaning of said cleaning member.

2. An apparatus according to claim 1, further comprising a cleaning liquid nozzle for supplying a cleaning liquid to said cleaning member.

3. An apparatus according to claim 1, wherein said cleaning member comprises an abrasive cloth having micropores in a cleaning surface thereof which is held in contact with the workpiece.

4. An apparatus according to claim 1, wherein said cleaning member comprises a sponge.

5. An apparatus according to claim 1, wherein said flat portion comprises a flat plate having diamond pellets thereon.

6. An apparatus according to claim 1, wherein said flat portion comprises a flat plate having a surface with minute grooves.

7. An apparatus according to claim 1, wherein said cleaning unit comprises one of a cleaning unit rotatable about an axis perpendicular to a surface, to be cleaned, of the workpiece and a cylindrical cleaning unit rotatable about an axis parallel to a surface, to be cleaned, of the workpiece.

8. An apparatus for cleaning a workpiece, comprising:
   a holding unit for holding a workpiece;
   a cleaning unit movable relatively to the workpiece;
   a cleaning member made of sponge provided on said cleaning unit for scrubbing the workpiece;
   a cleaning cup disposed in a retracted position of said cleaning unit and filled with a cleaning liquid for immersing said cleaning member therein, said cleaning cup having a flat portion for contacting said cleaning member; and
   a mechanism for pressing said cleaning member against said flat portion until said cleaning member is elastically deformed.

9. An apparatus according to claim 8, wherein said flat portion comprises a quartz plate.

* * * * *